United States Patent [19]
Bhatt et al.

[11] Patent Number: 5,707,893
[45] Date of Patent: Jan. 13, 1998

[54] METHOD OF MAKING A CIRCUITIZED SUBSTRATE USING TWO DIFFERENT METALLIZATION PROCESSES

[75] Inventors: Anilkumar Chinuprasad Bhatt, Johnson City; Ashwinkumar Chinuprasad Bhatt, Endicott; Robert Jeffrey Day, Dryden; Thomas Patrick Duffy, Endicott; Jeffrey Alan Knight, Endwell; Richard William Malek, Johnson City; Voya Rista Markovich, Endwell, all of N.Y.

[73] Assignee: International Business Machines Corporation, Armonk, N.Y.

[21] Appl. No.: 566,363

[22] Filed: Dec. 1, 1995

[51] Int. Cl.[6] ................................................. H01L 21/445
[52] U.S. Cl. ........................ 437/195; 438/678; 438/669
[58] Field of Search ........................ 437/195, 203, 437/230, 235, 245, 915, 944; 156/656.1, 645.1; 205/125

[56] References Cited

U.S. PATENT DOCUMENTS

| | | |
|---|---|---|
| 4,705,592 | 11/1987 | Bahrle et al. . |
| 4,810,332 | 3/1989 | Pan . |
| 4,866,008 | 9/1989 | Brighton et al. ................ 437/189 |
| 4,920,639 | 5/1990 | Yee . |
| 4,925,525 | 5/1990 | Oku et al. . |
| 5,017,271 | 5/1991 | Whewell et al. . |
| 5,050,038 | 9/1991 | Malaurie et al. . |
| 5,092,032 | 3/1992 | Murakami . |
| 5,098,860 | 3/1992 | Chakraverty et al. ............ 437/195 |
| 5,252,195 | 10/1993 | Kobayashi et al. . |
| 5,277,787 | 1/1994 | Otani et al. . |
| 5,354,712 | 10/1994 | Ho et al. ........................ 437/195 |
| 5,358,907 | 10/1994 | Wong ............................. 437/230 |
| 5,380,679 | 1/1995 | Kano ............................. 437/192 |
| 5,421,083 | 6/1995 | Suppelsa et al. . |

OTHER PUBLICATIONS

IBM Technical Disclosure Bulletin vol. 35 No. 6 Nov. 1992, p. 407, by Johann et al.
Microelectronics Packaging Handbook (R. Tummula and Eugene Rymaszewski), 1989—pp. 713–715, 904, 915.
Principles of Electronic Packaging (D. Seraphim, R. Lasky and C. Li) 1989, pp. 47–49, 342, 343, 389 and 390.

*Primary Examiner*—John Niebling
*Assistant Examiner*—Caridad Everhart
*Attorney, Agent, or Firm*—Lawrence R. Fraley

[57] ABSTRACT

A process for making a circuitized substrate is defined wherein the substrate is treated with two different, e.g., additive and subtractive, metallization processes. The process is thus able to effectively produce substrates including conductive features, e.g., high density circuit lines and chip heat-sinking pads, of two different degrees of resolution in a cost effective and expeditious manner. The resulting product is also defined.

15 Claims, 7 Drawing Sheets

METHOD OF MAKING A CIRCUITIZED SUBSTRATE USING TWO DIFFERENT METALLIZATION PROCESSES

TECHNICAL FIELD

The invention relates to methods of making circuitized substrates, e.g., printed circuit boards, and particularly those substrates capable of being utilized in information handling systems (computers) or the like. Such substrates typically include one or more dielectric layers sandwiched together with one or more electrically conductive layers which may function as power, signal, and/or ground layers in the completed structure.

BACKGROUND OF THE INVENTION

The manufacture of circuitized substrates such as printed circuit (or wiring) boards is an established art, with various examples of such processes described in the following U.S. Letters Patents:

U.S. Pat. No. 4,705,592—Bahrle et al
U.S. Pat. No. 4,925,525—Oku et al
U.S. Pat. No. 5,017,271—Whewell et al
U.S. Pat. No. 5,050,038—Malaurie et al
U.S. Pat. No. 5,252,195—Kobayashi et al
U.S. Pat. No. 5,277,787—Otani et al Various other publications also describe such processes, including, e.g, IBM Technical Disclosure Bulletin, Vol. 35, No. 6 (November/1992), p. 407.

Typically, the metallization processes used to deposit the desired conductive members, e.g., power planes, signal lines, etc., fall into one of two categories: (1) additive metallization; and (2) subtractive metallization. As a broad generalization, additive metallization involves the addition, e.g., using electroless copper plating into defined channels in a dielectric material, e.g., photoresist, while subtractive metallization involves the removal of unprotected portions of an earlier deposited metal, e.g., copper, layer to define the desired circuitry on the substrate's external surfaces. Both processes are described in greater detail hereinbelow.

A typical starting material for use in the additive metallization process is an electrically insulating (dielectric) material such as epoxy resin reinforced with glass fiber (more typically known as "prepreg"). Copper layers, e.g., each 0.5 mils thick, are laminated to both sides of the interim dielectric. A relatively large percentage, e.g., about 66 percent, or about 0.30–0.35 mils, of the copper is then removed using a known procedure such as etching. The external surfaces are then ground, cleaned and dried, following which a photoresist, e.g., negative-type, is applied and exposed in what is often referred to as a "blanket" exposure step. Registration holes and/or through-holes may then be formed, e.g., using punching, drilling, laser ablation, etc., the surfaces of such holes then "activated" with a palladium chloride solution. The negative resist is then removed (using a step referred to as "stripping") and the exposed surfaces of the substrate treated with a benzotriazole bonding agent and thereafter coated, again, with a layer of negative resist. This photoresist is exposed according to the desired conductive circuit pattern, and then developed. The substrate is now ready for the deposition (addition) of metal, e.g., copper, to provide the substrate's conductive circuitry.

The copper is deposited, typically, by immersion of the substrate in a copper bath for a prolonged period, e.g., several hours, during which the copper is electrolessly deposited to a desired thickness, e.g., 40 microns, including on the aforementioned remaining 5 microns of copper previously applied. The various holes, particularly the through-holes, serve to provide electrical connection between the opposing side circuitry and/or between one or both such circuitry and any internal conductive layers, e.g., power or ground planes. Following copper deposition, a thin layer of tin may be deposited onto the copper circuit lines and the defining photoresist then stripped. Any exposed portions of the thin (5 micron) copper may then be etched away following which the exposed tin-coated lines are treated, e.g., etched, to remove the tin. Inspection and electrical testing then typically follows.

The above-described additive process is especially adapted for providing circuit features, e.g., conductive lines, of high resolution. By the term high resolution is meant to include circuit lines of, e.g., only about 1–2 mils (thousandths) thickness, less than about 3 mils width and spaced at very close distances, e.g., no more than about 2.3 mils. Lines produced using this process are clearly distinguishable and, therefore, of satisfactory dimensions so as to function effectively in the final circuit board structure. Such a process has proven somewhat ineffective, however, in providing conductive features, e.g., a relatively large (e.g., 15 mil square) copper pad of lesser resolution which may also be desired as part of the final substrate product, e.g., to serve as a heat sinking member for a semiconductor device (chip) positioned thereon. For example, such a procedure, typically involving one or more wet activation processes, has resulted in the generation of hydrogen as a by-product, this hydrogen often causing "blistering" of the substrate as a result of penetration thereof into the dielectric epoxy resin material or by lying on the substrate's external surface during subsequent processing. Such blistering is obviously unacceptable when producing circuitized substrates wherein both high and low resolution conductive features are desired.

Regarding the subtractive metallization process, a typical starting dielectric material for use in same is also "prepreg". A copper layer is laminated to one or both sides of the dielectric. In the course of further processing, several such substrates can be packaged simultaneously. Through-holes and clearance holes are then drilled using, typically, numerically controlled automatic equipment. A copper base layer is deposited on the hole walls by purely chemical means, and then reinforced by electroplating. A photoresist pattern is then photolithographically generated on the surface of the copper-laminated substrates in those areas where the required conductive circuit lines are to be formed. The individual substrate is then fed through an etch system where the copper layer is etched off in the regions that are not protected by photoresist. That is, this copper is removed; hence the term "subtractive". After removal of the residual resist, only the circuit lines of the printed circuits are left on the epoxy resin substrate.

The subtractive method of metallization has the disadvantage that a relatively thick layer of copper must be laminated to the insulating substrate, most of the copper layer being removed upon subsequent etching. In addition, substantial undercutting typically occurs during etching, thereby limiting the resulting conductor width, thickness and spacings, such that those of high resolution (as defined above) cannot effectively be produced.

In view of the above, it is seen that any one of the above two metallization processes is inadequate for providing circuitized substrates of the type mentioned herein wherein the substrates are to include conductive metal features of both high and low resolution, e.g., closely spaced very thin circuit lines and relatively large heat sinking chip pads.

It is believed that a process capable of producing a circuitized substrate while utilizing many of the advantages of selected processes (e.g., the aforementioned additive and subtractive metallization processes), while avoiding some of the disadvantages thereof, would constitute a significant advancement in the art.

DISCLOSURE OF THE INVENTION

It is, therefore, a primary object of the present invention to enhance the art of producing circuitized substrates such as those of the printed circuit board variety designed particularly for usage in computer or the like environments.

It is a particular object of the invention to provide such a process which can be readily performed in an expedited manner, thereby rendering the process adaptable to mass production and the many advantages thereof.

In accordance with one aspect of the invention, there is provided a method of making a circuitized substrate which comprises the steps of providing a dielectric member including a first layer of electrically conductive material thereon, forming a first electrically conductive member on the dielectric member from the first layer of electrically conductive material using a first metallization process, providing a first layer of dielectric material on the dielectric material including at least one opening therein, and forming a second electrically conductive member in the opening of the first layer of the dielectric material using a second metallization process different from the first metallization process.

BRIEF DESCRIPTION OF THE DRAWINGS

FIGS. 9–12 are slightly larger in scale than FIGS. 1–8, while FIGS. 13 and 14 are slightly larger in scale than FIGS. 9–12, such enlargements being for illustration purposes.

BEST MODE FOR CARRYING OUT THE INVENTION

For a better understanding of the present invention, together with other and further objects, advantages and capabilities thereof, reference is made to the following disclosure and appended claims in connection with the above-described drawings.

As stated, FIGS. 1–14 represent various steps that may be utilized to produce a circuitized substrate in accordance with a preferred embodiment of the invention. By the term circuitized substrate as used herein is meant to define a substrate member including at least one dielectric layer and at least one layer of circuitry formed on the dielectric layer. Understandably, the invention as defined herein is readily capable of producing circuitized substrates of much greater complexity, including, e.g., those with several internal conductive planes (signal, power and ground) and with several plated through-holes (PTHs) designed for interconnecting selected ones of the substrate's conductive layers. Such a circuitized substrate may in turn form a printed circuit board (PCB) for utilization in a variety of products, including, e.g., computers. The invention is not limited, however, to such final end uses.

Figure 1:
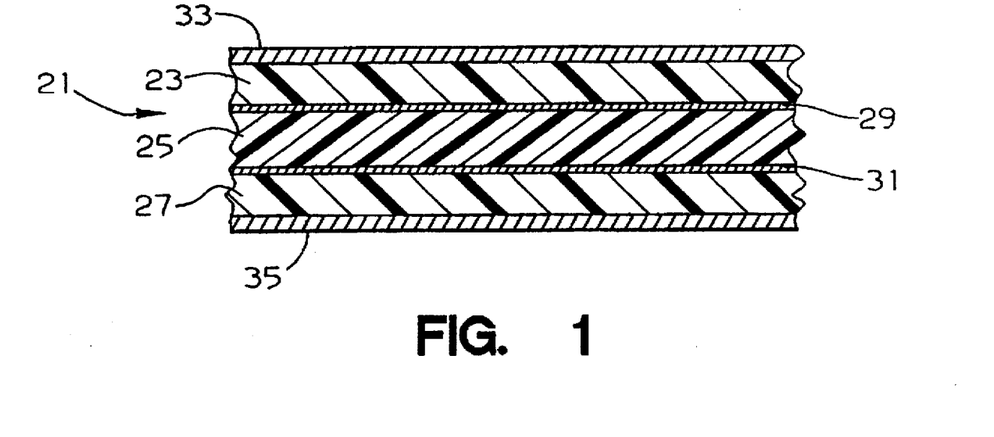
FIGS. 1–14 depict the various stages of producing a circuitized substrate, in accordance with one embodiment of the invention. Optional (albeit desired) steps, i.e., through-hole provision as shown in FIG. 3, are also shown.

In FIG. 1, there is shown a substrate member 21 which may serve as an initial member which is to be subjected to various processes (as defined herein) to eventually form the desired final product (circuitized substrate). Member 21 includes at least one dielectric layer 23, preferably of a known electrically insulative material such as fiberglass reinforced epoxy resin (also known in the industry as "FR4"). In the example of FIG. 1, two additional dielectric layers 25 and 27 are shown. At least two internal conductive planes 29 and 31 are also shown, in addition to external conductive layers 33 and 35. Member 21 is preferably formed by initially bonding (using a laminating operation) the 25, 29 and 31 elements as one structure. This structure can also be referred to as a core and, in one example, possessed an overall thickness within member 21 of about 20 mils (thousandths), the dielectric 25 having a thickness of about 17.6 mils and the two opposed conductive layers 29 and 31 each of a thickness of about 1.2 mils. The preferred dielectric 25 is FR4 and the preferred conductive layers 29 and 31 are each of copper.

Formation of member 21 is then preferably accomplished by individually aligning the dielectric layers 23 and 27 with this core, and then aligning the outer conductive layers 33 and 35. These elements are then laminated using known techniques to produce the subassembly shown as member 21. Member 21 as so produced may include an overall thickness of about 30 mils, with each of the laminated dielectric layers 23 and 27 having a thickness of only about 3.9 mils. The two outer conductive layers 33 and 35 may each possess an initial thickness (as shown in the laminated member 23 in FIG. 1) of about 0.8 to 1.2 mils.

Member 21 is laminated using known equipment and processes and it is therefore believed that further discussion with respect to such equipment and processes is not necessary.

Figure 2:
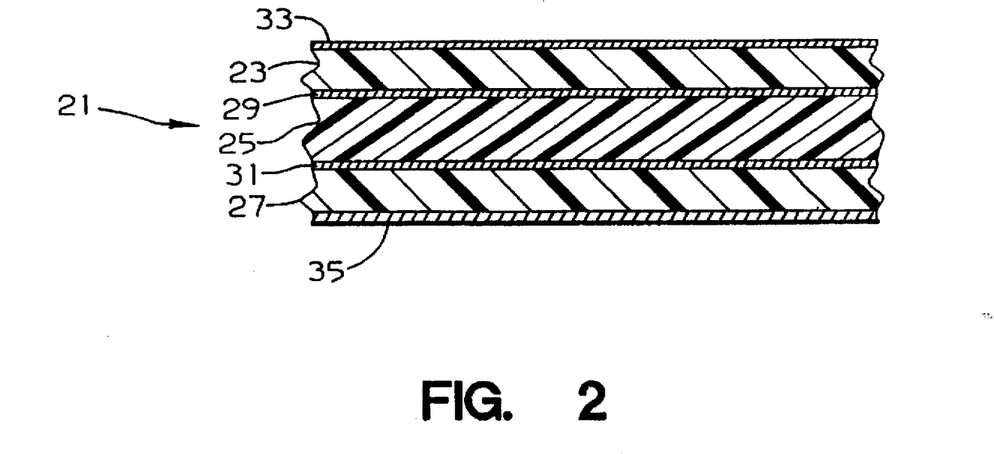

In the embodiment of the invention as shown in FIG. 2, the outer conductive layers 33 and 35 have been treated to reduce the thickness thereof. The preferred treatment is to subject these layers to a fluid etch (e.g., using cupric chloride, a well-known etchant) such that both layers now possess a thickness of less than only 0.2 mils. Such thickness reduction is accomplished using known etching equipment and process parameters, such that additional description is not believed necessary. It is understood, however, that fluid etching is not the sole means by which these layers can be reduced in thickness. The invention is thus not limited to such etching. In this particular embodiment, the etching was carried out with 3 molar cupric chloride at a temperature of about 135 degrees Fahrenheit (F.) contained within a horizontally conveyed etcher. The conveyor speed was adjusted to obtain the final defined copper thickness of 0.1–0.2 mils.

Figure 3:
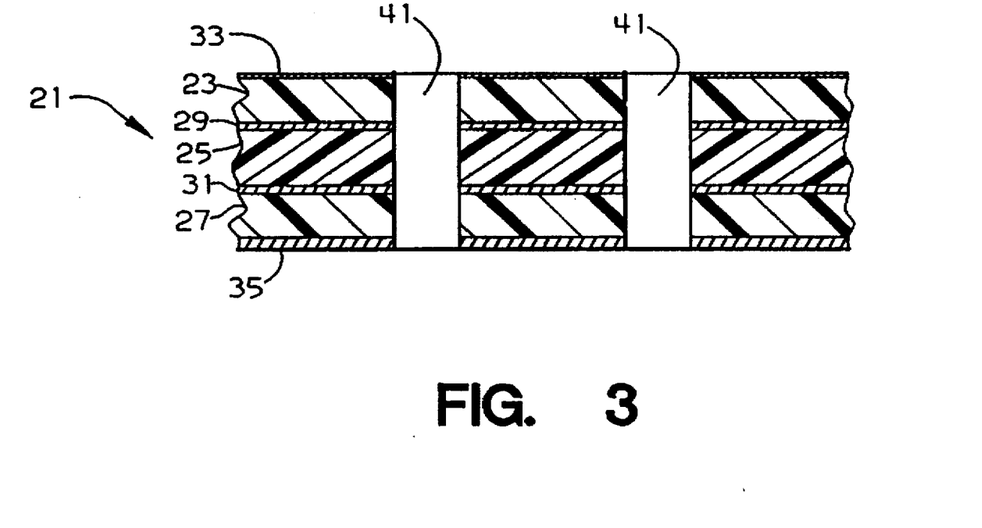

In FIG. 3, member 21, having the reduced thickness outer conductive layers 33 and 35, may be subjected to a drilling or the like operation in order to provide a plurality of through-holes 41 therein. The use of through-holes is well-known in the circuitized substrate field, these elements typically used to interconnect one or more internal/external conductive layers to thereby further enhance the operational capability of the finished product. It is understood that in accordance with the broader aspects of the invention, however, this represents an optional step and is not necessary to accomplish the main objectives described herein.

Holes 41 are preferably provided by drilling, but other procedures, e.g., laser ablation, may be used. In one example of the invention, a total of five hundred through-holes 41 were provided in a substrate of rectangular configuration having external dimensions of fourteen millimeters (mm) wide by fourteen mm long. Following the drill operation, these holes are deburred and otherwise chemically treated, e.g., desmeared, using sodium permanganate. Resulting through-holes each included a diameter of about twelve mils. The above procedures are known in the art and further description is not believed necessary.

Figure 4:
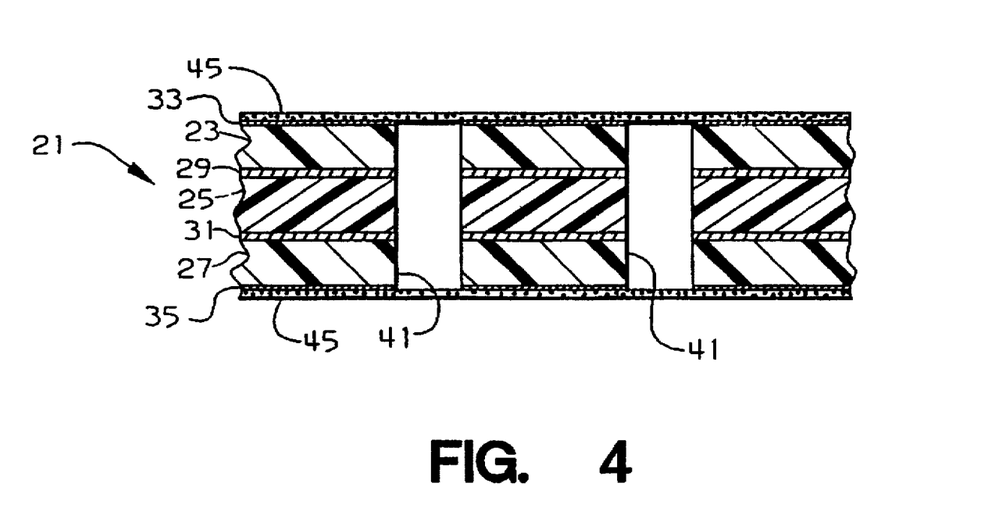

In FIG. 4, member 21 is subjected to a first metallization process in order to form a first electrically conductive member on the dielectric. In a preferred embodiment, several such members are formed, including on both upper and lower surfaces of member 21. The description provided herein will be specifically directed to the formation of but a few of these.

In FIG. 4, member 21 is subjected to the first of various steps in what is understood to be a process similar to (using some of the steps thereof) the aforementioned subtractive metallization process. In this process, a dry film of photoresist 45 is applied to member 21 to cover the conductive planes 33 and 35 and, significantly, to "tent over" (cover) holes 41. In a preferred embodiment, the photoresist 45 is CFI aqueous photoresist, available from Hercules, Inc. The significance of covering both ends of the through-holes 41 will be understood from the following.

Figure 5:
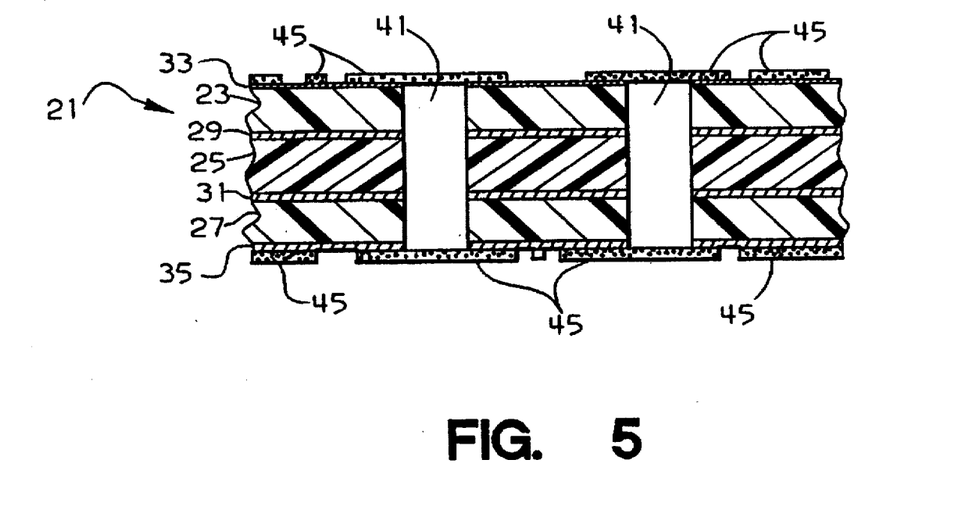

In FIG. 5, photoresist 45 is exposed and developed, following which selected parts thereof are removed, all of the above using procedures known in the art. The result, as shown in FIG. 5, is that a plurality of remaining photoresist elements 45 are shown positioned on the upper and lower surfaces of member 21. Understandably, under each of these remaining portions 45 is located the respective, substantially thin conductive layer 33 or 35, except of course at locations wherein the photoresist bridges holes 41.

Figure 6:
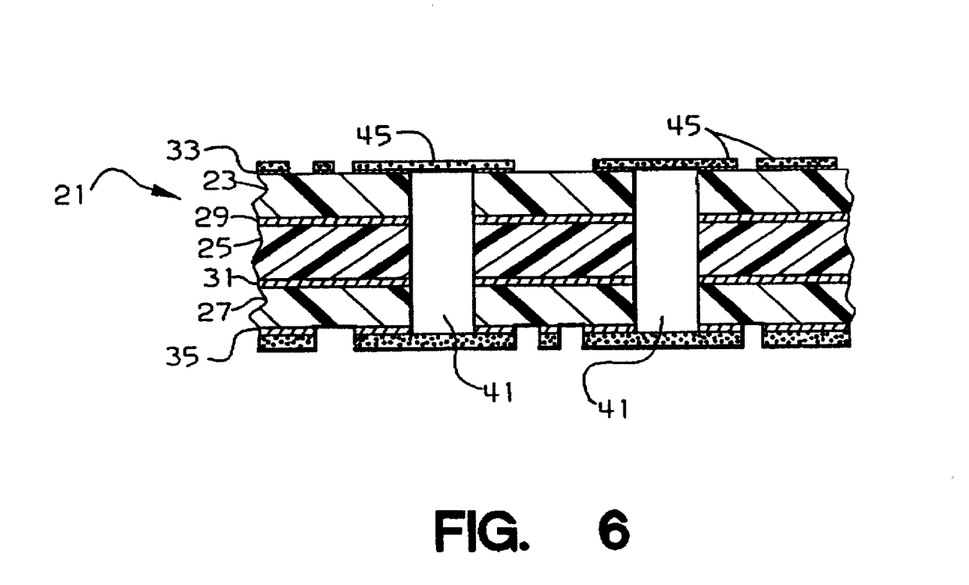

In FIG. 6, member 21 has been subjected to an etching operation wherein the etchant, e.g., cupric chloride, is used to remove exposed portions of the conductive layers 33 and 35. Significantly, there is still no conductive material within the holes 41. Further, the tenting portions of photoresist 45 have thus prevented potentially adverse chemical materials such as cupric chloride or others from penetrating holes 41 and thereby possibly attacking the internal walls of the holes.

Figure 7:
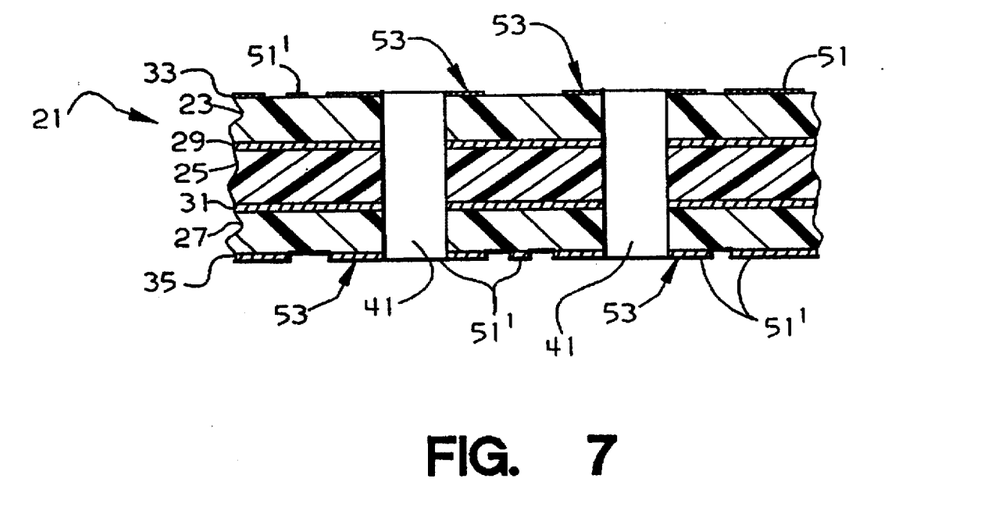

The remaining portions of resist 45 are next stripped by subjecting member 21 to a solution of sodium hydroxide. The remaining sections of the conductive layers 33 and 35, being so formed by this described subtractive metallization process, are of relatively low resolution in comparison to that of the conductive elements to be later provided herein. In one example, a pad 51 (in addition to several other separate sections 51', including those land pad areas around each of the external surfaces of member 21 relative to holes 41) was formed. Only one pad 51 is shown in FIG. 7, but it is understood that several others may be readily provided in accordance with the teachings herein. As will be understood, pad 51 is to form a part of a heat-sinking conductive structure on the upper (or lower) surface of member 21 designed for having a semiconductor device (chip) positioned thereon. If pad 51 is electrically coupled to other conductive parts of the conductors 51', the chip may thus be coupled to several other portions of the conductive layers within the formed member 21. In FIG. 7, such connections have not yet been made and will be provided in accordance with the teachings hereinbelow. In FIG. 7, it is thus seen that selected portions of the unprotected metal within the layers 33 and 35 have been removed from member 21; hence the term "subtractive" is used to describe such a metallization process.

In one example, a relatively large rectangular pad 51 having side dimensions of about 15 mm by 15 mm was formed. Additionally, the respective lands 53 located about the cylindrical holes 41, were also substantially cylindrical with an overall outer diameter of 0.65 mm. It is thus understood that such large dimensions serve to define conductive members, e.g., lines and pads, of relatively low resolution. Significantly, the process as defined thus far has been able to provide such relatively low resolution conductive structures with a minimum of cost and effort in comparison to many other known techniques in the art.

Figure 8:
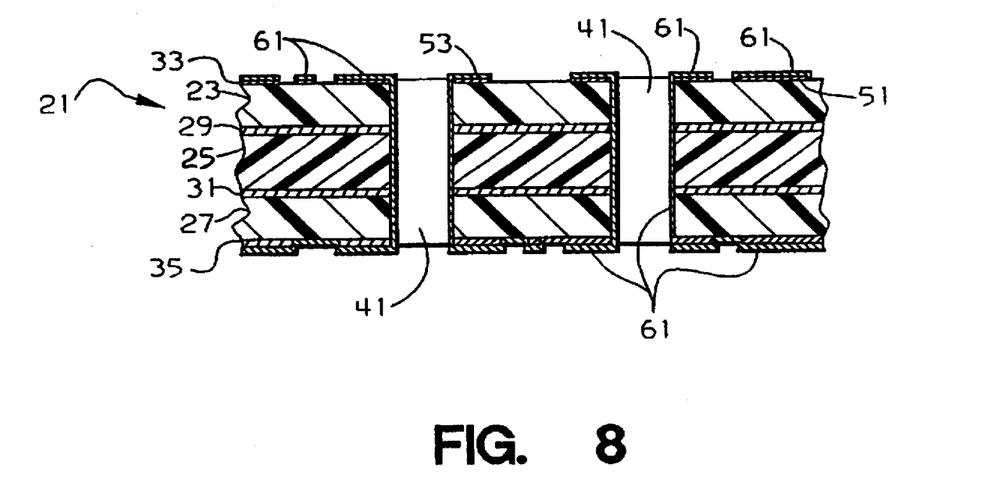

In FIG. 8, member 21 is now subjected to a first of various steps which may be defined, as stated above, as similar to some of those used in additive metallization process. In FIG. 8, a thin conductive layer (stripe) of palladium seed layer 61 is provided to cover substantially all of the exposed, external surfaces of member 21. As seen in FIG. 8, the palladium seed material 61 extends into holes 41 to provide a substantially uniform coating therein. This seed layer also, significantly, is deposited within the exposed open portions between members 53 and 51 such that the previously exposed, dielectric surfaces of member 21 all include this thin layer of metallization. In one example, a palladium layer having a surface concentration of about three micrograms per square centimeter (cm) was provided. Significantly, it is seen that this palladium also is deposited atop the remaining portions of the conductive layers 33 and 35, including the through-hole lands 53.

Although palladium is described as the material used in the above example, this is not meant to limit the invention in that other metals, e.g., copper, may be used. The preferred step for applying the palladium seed layer is to utilize a vertical dip process which includes the following list of chemicals to be used in the order listed: (1) a 1–5 minute dip in an alkaline cleaner; (2) a 1–2 minute dip in a cationic polyacrylamide solution; (3) a 0.5–2 minute dip in a solution of sodium persulfate or like copper etchant with a known etch rate of 1–2 microns per minute; (4) a 1–5 minute dip in a collodial solution of palladium-tin; and (5) a 1–2 minute dip in a 1 molar solution of sodium hydroxide or similar accelerator solution. These steps to be followed by a drying step, e.g., 20 minutes at 175 degrees F. Rinses with deionized water may occur between one or more of these steps.

Figure 9:
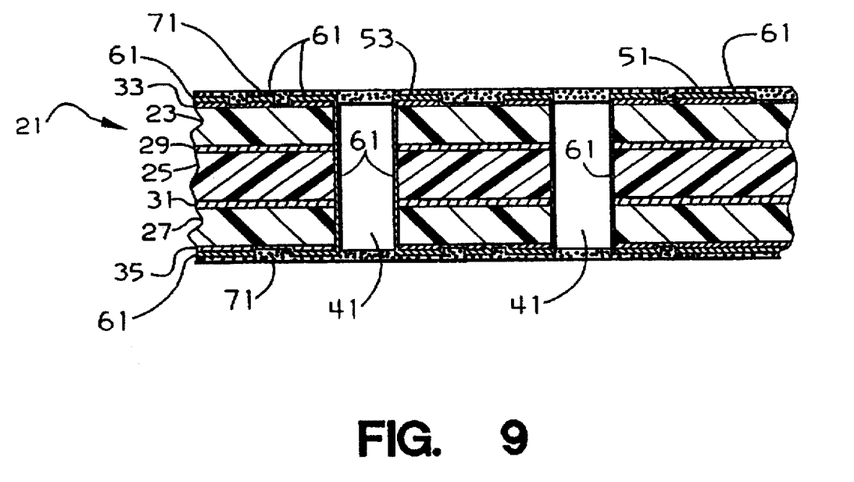
Figure 10:
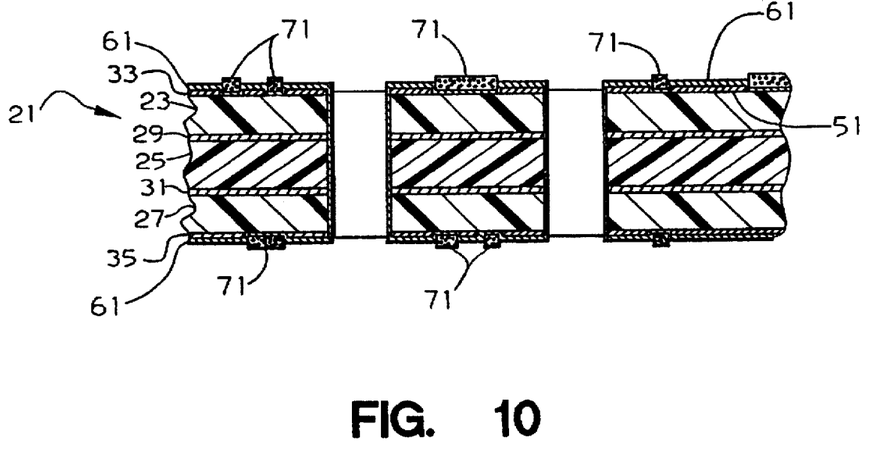

In FIG. 9, layers of photoresist 71 have been provided to both the upper and lower surfaces of member 21. Preferably, the photoresist is provided in dry film form as was done in the embodiment shown in FIG. 4. The resist used here is referred to as "T-168" and is available from the E. I. duPont deNemours Company, and possessed an initial thickness of only about 1.0 mil. Portions of photoresist 71 are exposed, developed and removed to leave the configuration of individual photoresist segments 71 as shown in FIG. 10. Significantly, the resist is removed from the larger portion 51 and the corresponding layer 61 covering portion 51, to thereby leave a dual metal layered conductor at this part of member 21. Understandably, it is again worth mentioning that several such members can be produced, depending on the operational requirements for the invention. The remaining portions 71 of photoresist thus function to protect the respective underlying thin conductive parts of layer 61. It is further noted that the thickness of the remaining photoresist portions 71 allow these portions to project slightly above the substantially planar surface of conductor 61.

Figure 11:
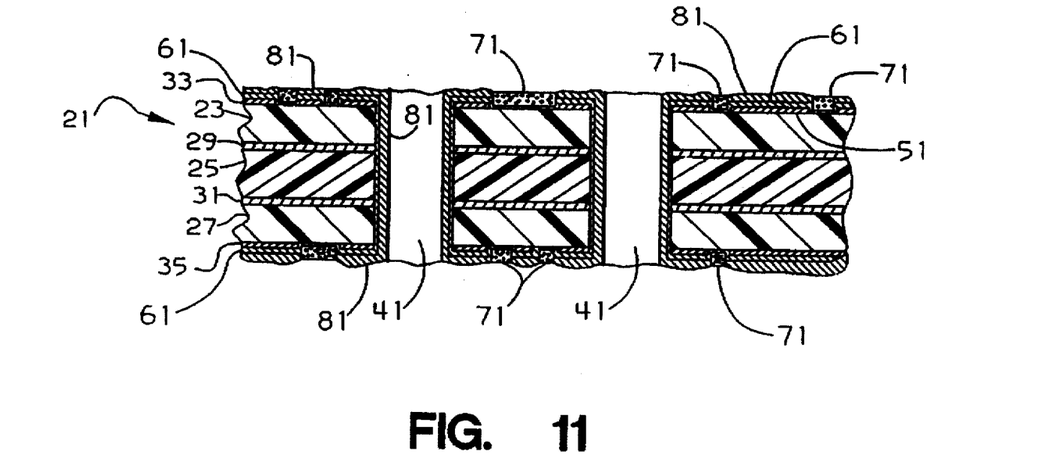

In FIG. 11, a layer 81 of conductive metal, e.g., copper, is deposited on the upper and lower outer surfaces of member 21, including within through-holes 41. These through-holes are thus understood to be comprised of two metals (palladium, copper) as is true for the other illustrated upper and lower surfaces of member 21. Of further significance, however, it is understood that some areas on the upper and lower surfaces now include three conductive metals, e.g., the underlying thin copper pad 51, the covering palladium layer 61 and finally, the most recently added copper layer 81. Notably, copper is not deposited onto the upper surfaces of the portions 71 of photoresist as was previously applied. This is because the process used (electroless plating) does not result in metal such as copper being deposited on the dielectric or the like materials such as photoresist sections 71.

Figure 12:
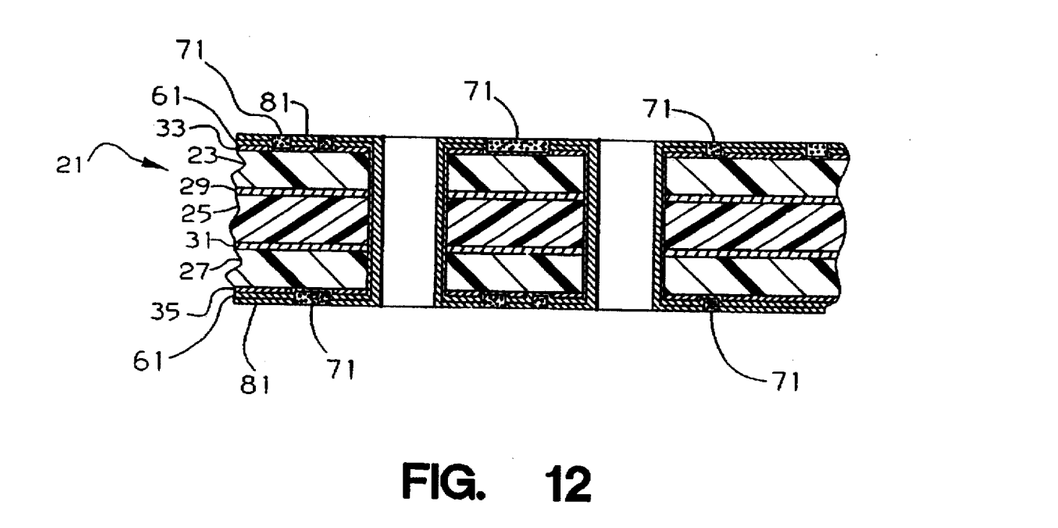

The above copper plating process is accomplished by immersion of member 21 in an autocatalytic electroless copper plating solution for a time of between 5–24 hours. The typical time is 11 hours, or that time required to achieve a copper thickness of approximately 1.0 mil (25.4 microns). It is further noted in FIG. 11 that the somewhat rougher outer surface of copper 81 projects slightly above the substantially planar outer surfaces of the photoresist portions 71. Accordingly, both upper and lower outer surfaces are planarized, the preferred planarization process being a mechanical one, e.g., sanding or the like. Other processes, e.g., using pumice with a sodium silicate solution may also be used and the invention is not limited to that described above. The result is a planar outer surface (excluding of course holes 41) on both the upper and lower surfaces of member 21, as depicted in FIG. 12.

Figure 13:
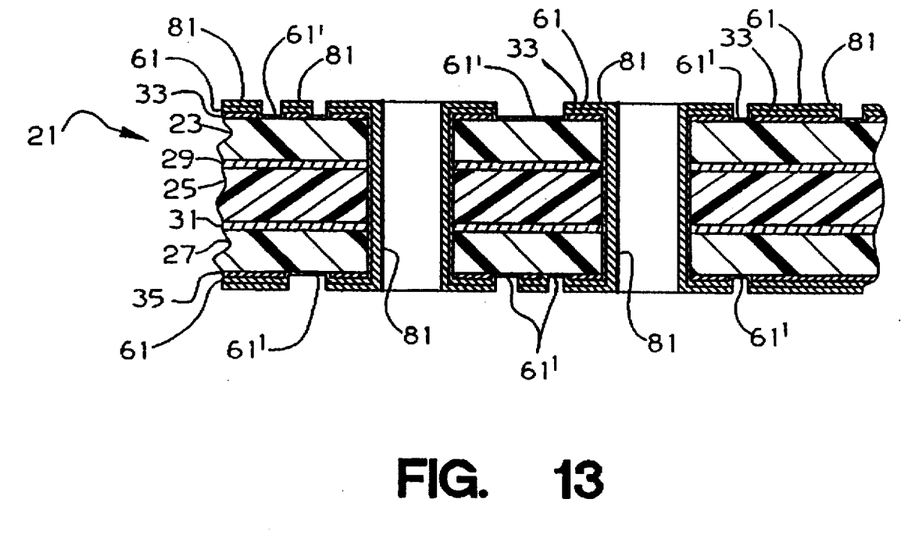

In FIG. 13, the remaining photoresist portions 71 have been removed so as to expose the remaining parts of the palladium seeded layers on the upper and lower dielectric portions of member 21. These exposed sections are represented by the numeral 61' in FIG. 13. Strip removal is preferably accomplished using propylene carbonate, G-butyrolactone, methylene chloride, etc., in a horizontally conveyed spray machine which includes a mechanical brushing action.

Figure 14:
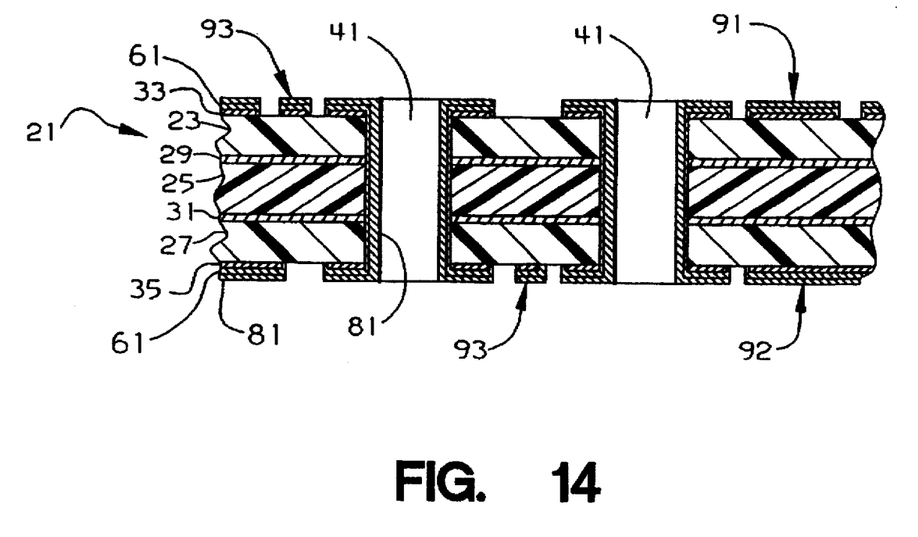

In FIG. 14, member 21 has been exposed to a seed stripping operation in which the exposed portions 61' of the palladium seed are removed. Preferably, this is accomplished by exposing the surfaces of member 21 to a solution of sodium cyanide (two grams per liter at 52 degrees Celsius (C.)) for a period of about 20 minutes. This is accomplished using a vertical dip process. This process step is then followed by a back at 180 degrees C. for about 4 hours. Member 21 is then processed for a second time through the sodium cyanide solution for 20 minutes to effectively maximize the removal of the palladium from the dielectric surfaces.

Significantly, the upper and lower surfaces of member 21 include the earlier described pad(s) which now includes the added layer of copper thereon, thereby forming a relatively thick conductive pad for member 21. This pad is represented by the numeral 91 in FIG. 14. It is understood, of course, that several other pads, including that represented by the numeral 92 in FIG. 14 can be added. Additionally, smaller pads, e.g., which may represent conductive lines, such as represented by the numeral 93 in FIG. 14, may also be formed. As seen in FIG. 14, the conductive pads and coated through-holes are not in electrical connection along the upper and lower surfaces of member 21, due to the removal of the remaining conductive layer of palladium. The above process wherein quantities of metal are added up to form the circuitry and other conductive members for the product may thus understandably be referred to as one form of an additive metallization process. Such process, as defined herein, is substantially different than the aforementioned subtractive form of metallization process used earlier above, but, uniquely, has been proven in the instant invention to be readily adaptable for use therewith in the combination defined. The circuitized substrate member in FIG. 14 can now have one or more semiconductor devices coupled thereto, e.g., at pad 91. Prior to such addition, it is preferred to conduct various electrical tests on the circuitized substrate. Significantly, pad 91 is seen as being "blister free" as a result of the initial formation of a first pad element on the substrate's dielectric surface which substantially covers the dielectric to prevent "blistering" which could occur during the second, different metallization process, particularly one in which a relatively high concentration of hydrogen may result.

Thus there has been shown and described a method of making a circuitized substrate in which at least two substantially different metallization procedures are utilized, depending on the resolution needed. In the first step (using selected steps similar to those used in subtractive metallization) electrical conductors of relatively low resolution were formed. Subsequently, selected steps of an entirely different metallization process, e.g., a form of an additive metallization process, were used to now define conductive members of much greater resolution. For example, in the structure of FIG. 14, the lines (i.e., number 93 to the far left in FIG. 14) possessed a width of less than 3 mils and a thickness of only about 1–2 mils. The spacing between this conductive member and its nearest adjacent conductor may be no greater than about 2.3 mils. The invention thus combines the attributes of additive and subtractive metallization in a unique manner to produce a product having conductive members of different resolution thereon while saving considerable added expense as would be required if only additive metallization were utilized, such metallization being essential to provide the high resolution needed for various portions of the resulting circuitry layers. The invention is thus deemed to represent a significant advancement in the art.

While there have been shown and described what are at present considered the preferred embodiments of the invention, it will be obvious to those skilled in the art that various modifications and changes can be made therein without departing from the scope of the invention as defined by the appended claims.

What is claimed is:

1. A method of making a circuitized substrate comprising the steps of:

providing a dielectric member including at least one dielectric layer having a first layer of electrically conductive material thereon;

forming a first electrically conductive member on said at least one dielectric layer of said dielectric member from said first layer of electrically conductive material using a first metallization process wherein some of said first layer of electrically conductive material is removed;

providing a second layer of electrically conductive material on said at least one dielectric layer including on said first electrically conductive member:

providing a second dielectric layer on said second layer of electrically conducting material and thereafter removing portions of said second dielectric layer to expose portions of said second layer of electrically conductive material, including over said first electrically conductive member; and forming second electrically conductive members on said exposed portions of said second layer of said electrically conductive material using a second metallization process different from said first metallization process wherein electrically conductive material is added to said exposed portions of said second layer of electrically conductive material, including onto said second layer of electrically conductive material over said first electrically conductive member, thereby providing said circuitized substrate.

2. The method of claim 1 wherein said second electrically conductive members are of a greater resolution than said first electrically conductive member.

3. The method of claim 1 wherein said first layer of electrically conductive material is positioned on said dielectric member using a lamination process.

4. The method of claim 1 wherein said first metallization process is a subtractive metallization process and said second metallization process is an additive metallization process.

5. The method of claim 1 wherein said second layer of dielectric material is positioned on said first layer of electrically conductive material in the form of a sheet.

6. The method of claim 1 wherein said some of said first layer of electrically conductive material is removed using an etching process.

7. The method of claim 1 wherein said second dielectric layer is photoresist material, said removing of said portions of said second dielectric layer being accomplished using an exposure process in which selected regions of said photoresist are exposed and a development process in which said exposed selected regions are removed.

8. The method of claim 1 further including providing at least one through-hole in said dielectric member, including through said at least one dielectric layer and said first layer of electrically conductive material, prior to the step of positioning said second dielectric layer, said second dielectric layer covering said through-hole.

9. The method of claim 8 wherein said some of said first layer of electrically conductive material is removed using an etching process, said second dielectric layer covering said through-hole protecting said through-hole during said etching process.

10. The method of claim 1 wherein said added electrically conductive material is added to said exposed portions of said second layer of electrically conductive material using an electroless plating process.

11. The method of claim 10 wherein said electroless plating process comprises a plurality of dipping steps wherein said dielectric member is dipped in a plurality of different solutions, followed by a drying step in which said dielectric member is substantially dried.

12. The method of claim 1 further including planarizing said second electrically conductive members.

13. The method of claim 12 wherein said planarizing is accomplished using a mechanical process.

14. The method of claim 13 wherein said mechanical process is sanding.

15. The method of claim 8 wherein said at least one through-hole is provided using a drilling process.

* * * * *